United States Patent [19]

Beckenhauer

[11] 4,451,819

[45] May 29, 1984

[54] METHOD AND APPARATUS FOR DECODING BINARY DATA

[75] Inventor: Robert L. Beckenhauer, San Jose, Calif.

[73] Assignee: Memorex Corporation, Santa Clara, Calif.

[21] Appl. No.: 275,682

[22] Filed: Jun. 22, 1981

[51] Int. Cl.³ .......................................... H03K 13/24
[52] U.S. Cl. ............................ 340/347 DD; 360/39; 370/108
[58] Field of Search ................. 340/347 DD; 360/39, 360/40; 370/108

[56] References Cited

U.S. PATENT DOCUMENTS

| | | | |
|---|---|---|---|
| 3,689,899 | 9/1972 | Franaszek | 340/347 DD X |
| 3,908,084 | 9/1975 | Wiley | 370/108 X |
| 4,044,347 | 8/1977 | Van Voorhis | 340/347 DD |
| 4,115,768 | 9/1978 | Eggenberger et al. | 340/347 DD |
| 4,146,909 | 3/1979 | Beckenhauer et al. | 360/39 |

Primary Examiner—T. J. Sloyan
Attorney, Agent, or Firm—Nathan Cass; David W. Heid; Kevin R. Peterson

[57] ABSTRACT

An apparatus for decoding binary data from one form to another has a register adapted to receive the input bit signals. A plurality of data paths are connected to the register, with a delay means in at least one of the paths. Decoding means is adapted to generate output bit signals in response to the input bit signals. Logic means determines the correct phase relationship between the input bit signals and the output bit signals. Switching means, responsive to the logic means, selects the data path from the register to produce the correct phase relationship between the input bit signals and the output bit signals.

12 Claims, 8 Drawing Figures

(2,7) CODE

| DATA WORD | CODE WORD |
|---|---|
| 1 0 | 0 1 0 0 |
| 0 1 0 | 1 0 0 1 0 0 |
| 0 0 1 0 | 0 0 1 0 0 1 0 0 |
| 1 1 | 1 0 0 0 |
| 0 1 1 | 0 0 1 0 0 0 |
| 0 0 1 1 | 0 0 0 0 1 0 0 0 |
| 0 0 0 | 0 0 0 1 0 0 |

CASE II:
$X_7 = 1$ WHEN $1F = 1$
$Q_{SW_1} = \phi$ AT TIME OF DECODER PHASING ENABLE

FIG. 5(C)

CASE III:

$X_7 = 1$ WHEN IF = $\phi$
$Q_{SW_1} = 1$ AT TIME OF DECODER PHASING ENABLE

METHOD AND APPARATUS FOR DECODING BINARY DATA

BACKGROUND OF THE INVENTION

The present invention relates to a method and an apparatus for converting binary signals in one form, representative of binary data, to binary signals of another form, representative of the same binary data. More particularly, the present invention relates to a decoding method and apparatus wherein there are more bit signals of the data in the one form than the bit signals of the same data in another form.

Binary data for use in digital computers is well known. In a number of uses, typically when the binary data is stored on some peripheral equipment, such as a magnetic disc or tape drive, the binary data within the computer must be encoded by some suitable coding means. Various codes, such as a run length limited code employing variable length words, or fixed length word, are taught by the prior art. See, for example, U.S. Pat. Nos. 3,689,899, 4,115,768, and 4,146,909. A number of specific codes are taught by the prior art. For example, the code known as the (2,7) code is disclosed in U.S. Pat. No. 3,689,899. With the (2,7) code, the code dictates that for every single bit of data, two code bits would be generated. Thus, for any data word comprising of n bits, 2n bits of encoded data would be generated by using the (2,7) code. Another code taught by that same patent is the (1,8) code. With the (1,8) code, for every two bits of data, three bits of code are generated. In general, with any run length limited code using variable length words, a plurality of code bits are generated for every single bit of data. While run length limited code using variable length words generates more code bits per bit of data code, they are more efficient than codes that use fixed length words. However, with run length limited code, there is, in general, a problem during readback with regard to the correct framing or the correct phase relationship between the encoded bits and the decoded data bits. For example, with the (2,7) code, for each single bit of data, two bits of the code are generated, bit a and bit b. During the playback or the decoding phase of the operation, it is necessary to distinguish for the decoder when the decoder should commence. If the decoder begins with bit a, then the data bits decoded would be in phase with the encoded bits. Conversely, if the decoder commences to decode at bit b, the data bits generated thereby would be out of phase with the encoded bits and would be incorrect representations of the encoded bits. Thus, it is crucial that the decoded data bits be in phase with the encoded bits.

One technique taught by the prior art to correctly insure the phase alignment between the decoded data bits, running at a frequency 1F, and the encoded data bits, running at a frequency of 2F, (using the (2,7) code) is to adjust the 1F clock such that the correct phase relationship is achieved. (See, for example, IBM Technical Disclosure Bulletin, Vol. 21, No. 1, June 1978, page. 326.) The manipulation of the clock within the computer system to achieve a correct phase relationship between the decoded data bits and the encoded data bits tends to be difficult to achieve. Moreover, this manipulative technique is less reliable due to the effects on the entire system's timing. In particular, if a microprocessor is involved, such manipulation of the system clock can have adverse consequences on the rest of the system.

SUMMARY OF THE INVENTION

In accordance with the apparatus of the present invention, the decoding means for converting input bit signals representative of binary data in one form to output bit signals of the same data in another form, according to a code wherein there are more input bit signals than the output bit signals of the same data, the decoding means has an input shift register means adapted to receive the input bit signals. Further, there are a plurality of data paths from the register means. A delay means is in at least one of the data paths. Decoding means are adapted to generate the output bits in response to the input bits according to said code. Logic means are provided for determining the correct phase relationship between the input bit signals and the output bit signals. Finally, switching means responsive to the logic means is provided which is capable of selecting the data path from the register means to produce the correct phase relationship between the input bit signals and the output bit signals.

A method of using said apparatus is also taught by the disclosure herein.

BRIEF DESCRIPTION OF THE DRAWINGS

FIGS. 5(a-d) are four cases of the truth table for the preferred embodiment shown in FIG. 4.

DETAILED DESCRIPTION OF THE DRAWINGS

Figure 1:
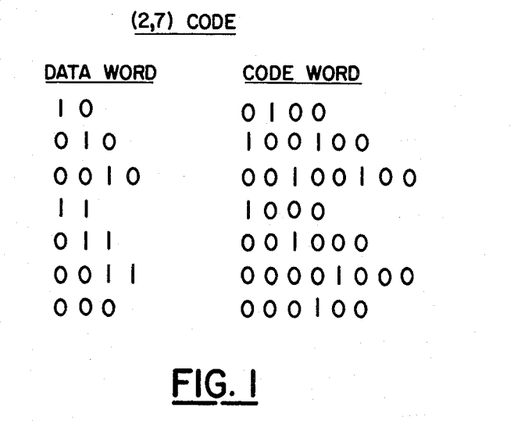
FIG. 1 is a dictionary of the (2,7) code.

Referring to FIG. 1, there is shown a dictionary of the (2,7) code. The (2,7) code dictionary provides that for each data word there is a unique code word associated therewith. For example, for the data word comprising of the bits "11", a code word comprising of bits "1000" would be the corresponding code word for that data word. Conversely, for each code word generated, a unique set of data words is associated thereby. Thus, if a code word comprising of the bits "0100" were encountered, this would correspond with the data word comprising of the bits "10". Although the description of the preferred embodiment of the present invention set forth hereinafter will be discussed with regard to the (2,7) code, it should be understood that the apparatus and method of the present invention is in no way limited to the type of code that is used.

Figure 2:
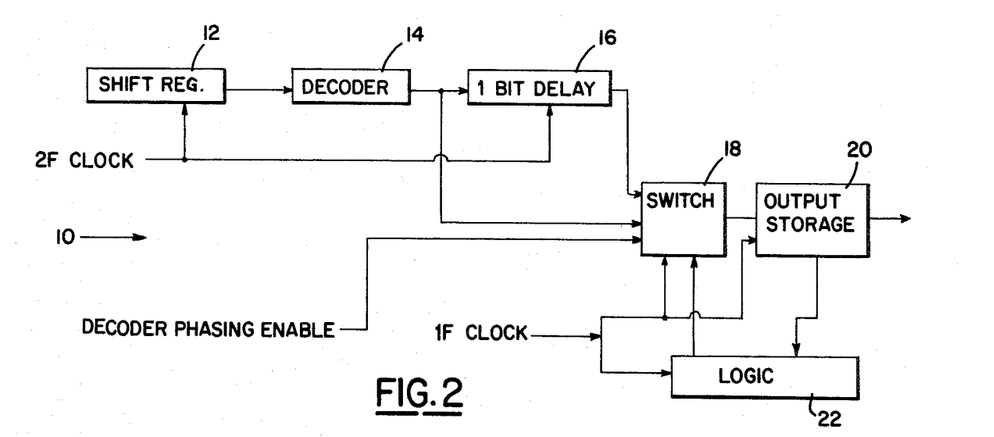
FIG. 2 shows the preferred embodiment of the apparatus of the present invention in block diagram form.

Referring to FIG. 2, there is shown a preferred embodiment of the apparatus 10 of the present invention shown in block diagram form. The apparatus 10 comprises a shift register 12 into which input bit signals are entered. The encoded bits in the shift register 12 are decoded by a decoder 14. From the decoder 14, the decoded data is entered into a one bit delay 16. Both the shift register 12 and the one bit delay 16 operate at the input bit signal rate of 2F, as regulated by a 2F clock. From the decoder 14 the data also enters into switch 18. The one bit delay 16 is also entered into switch 18. Switch 18 determines which of the data paths from the one bit delay 16 or from the decoder 14 would be selected to go into the output storage 20. Data from the output storage 20 is read out. Data from the output storage 20 also enters into a logic 22. Logic 22 compares the decoded data bits to the anticipated decoded data bits (or the decoded data bits that should be present) and determines the data path as set by the switch 18. Accordingly, logic 22 is capable of switching the switch 18 to choose the data path such that the output decoded data bits are in correct phase relationship with the encoded data bits.

Figure 3:
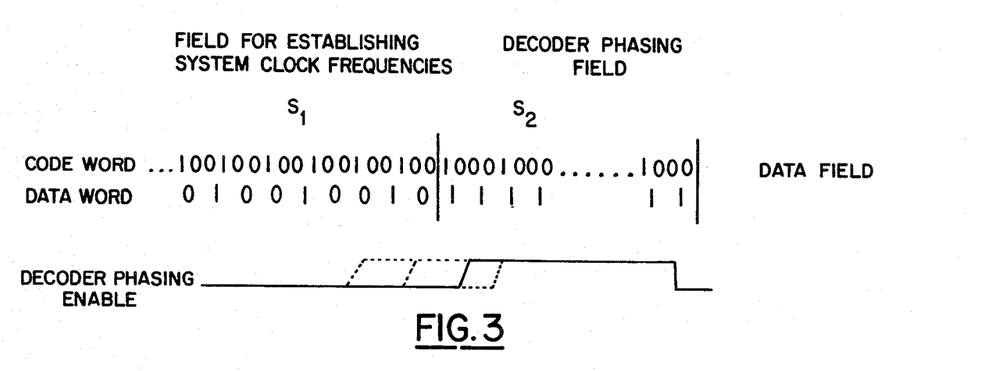
FIG. 3 shows the typical preamble encoded words that are generated upon readback prior to the encoded data bits, and the desired relationship of the control signal "Decoder Phasing Enable".

Typically, the data to be decoded is data from a disc storage device. The encoded data is preceded by two streams of a priori known encoded words which are read into the apparatus 10 of the present invention. As shown in FIG. 3, the first stream, as designated by $S_1$, comprises of repeating bit patterns "100100". This would correspond to the decoded data word of "010". This stream, $S_1$, represents the highest possible encoded bit rate for this particular code. The computer recognizes this as the first stream of bits and uses those bits to establish the frequency for the clocks 1F and 2F respectively. The higher the repetition rate of the $S_1$ bit stream, the more quickly the 2F frequency can be stabilized. The first stream of known bits, $S_1$, has no bearing on the present invention and, therefore, will not be discussed further hereinafter. The first stream is followed by a second stream, $S_2$, of data bits which comprises the repeating bit pattern "1000". From the dictionary as set forth in FIG. 1, according to the (2,7) code, this stream of data bits should be decoded into the bits of "11". Logic 22 compares the decoded bits that are in the output storage 20 to the anticipated decoded data words, i.e., the data stream comprising the bits "11", and determines which data path from the shift register 12 the data should flow as selected by the switch 18.

Figure 4:
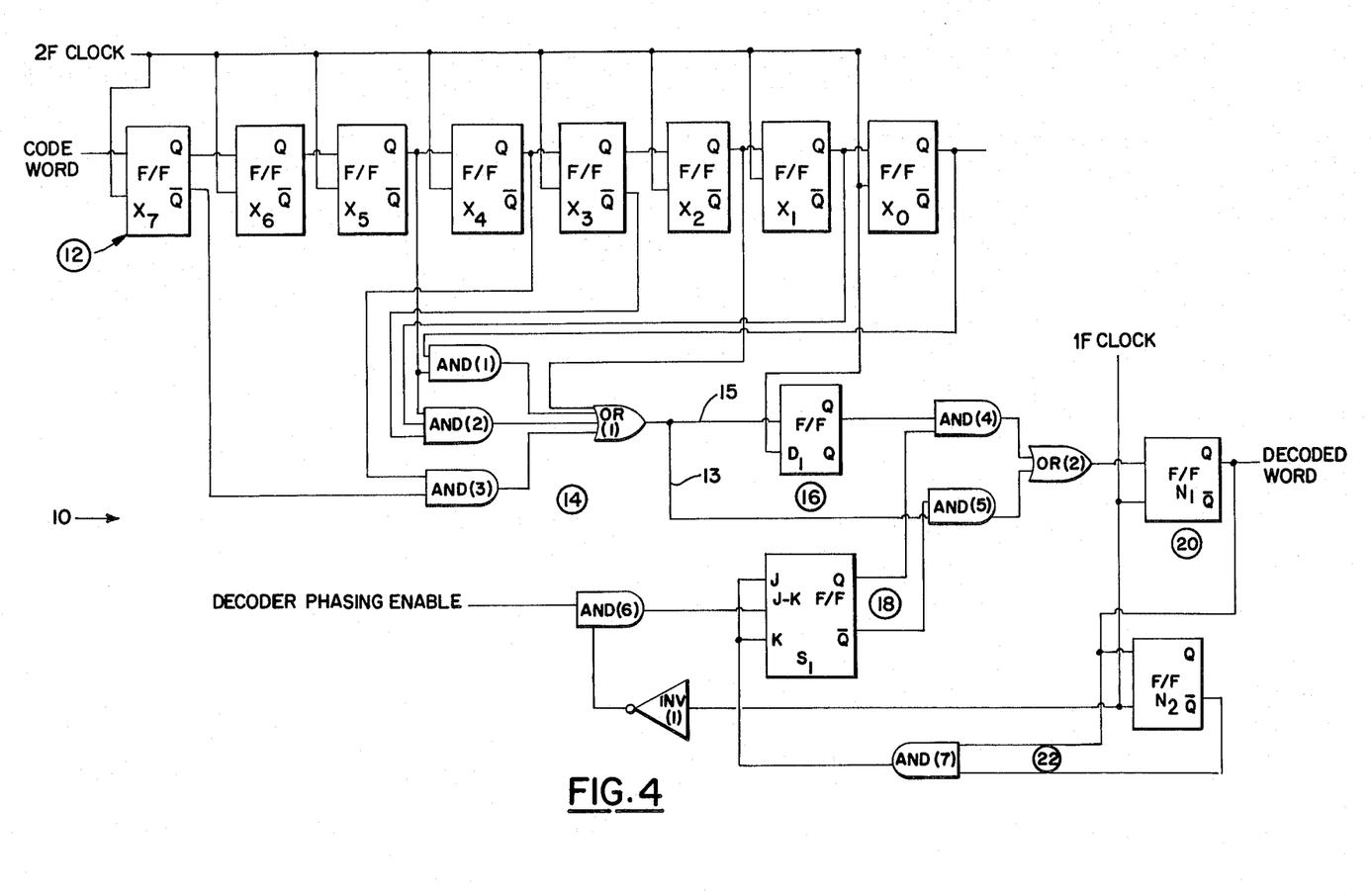
FIG. 4 is a logic circuit diagram of the preferred embodiment of FIG. 2.
Figure 5A:
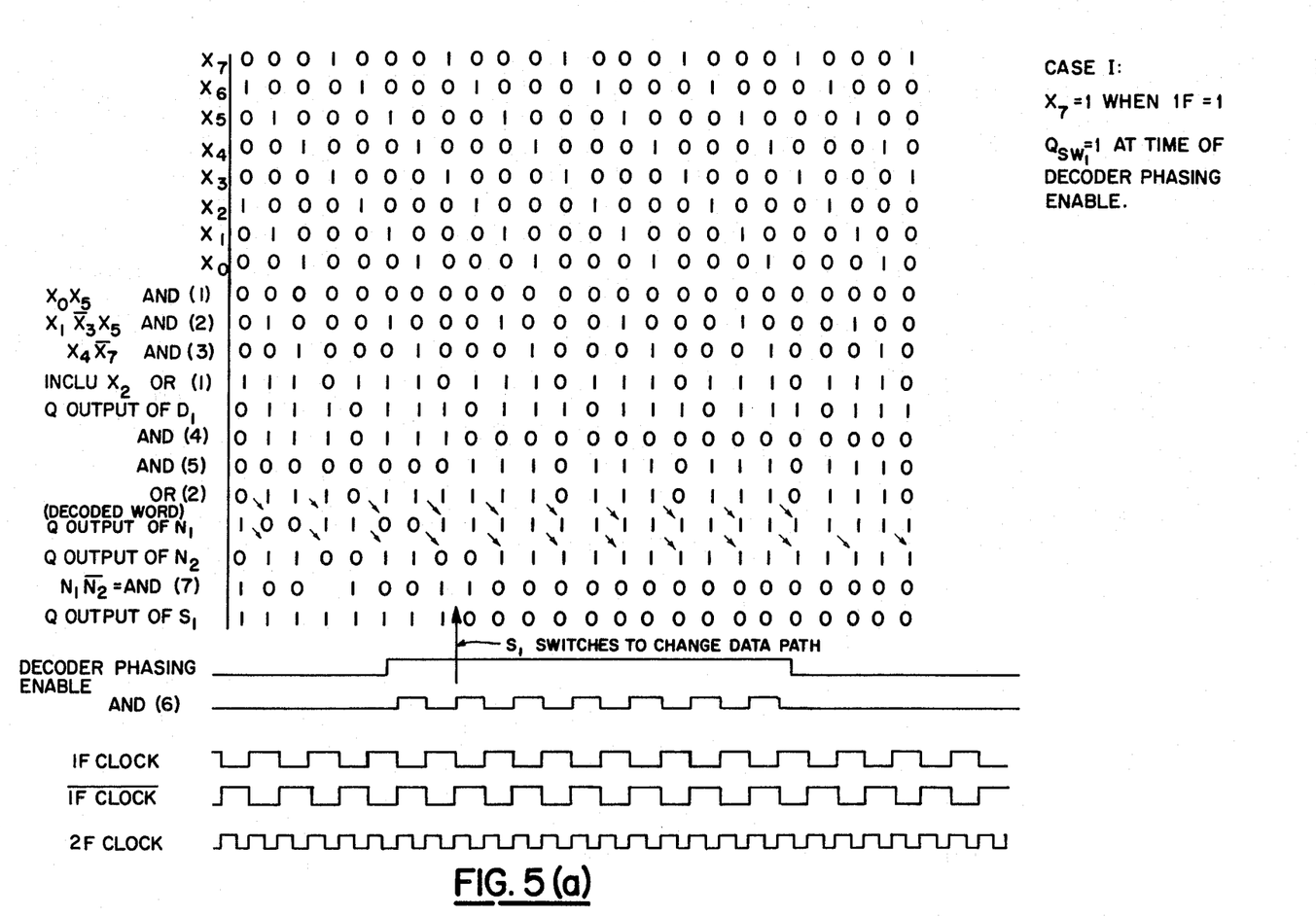
Figure 5B:
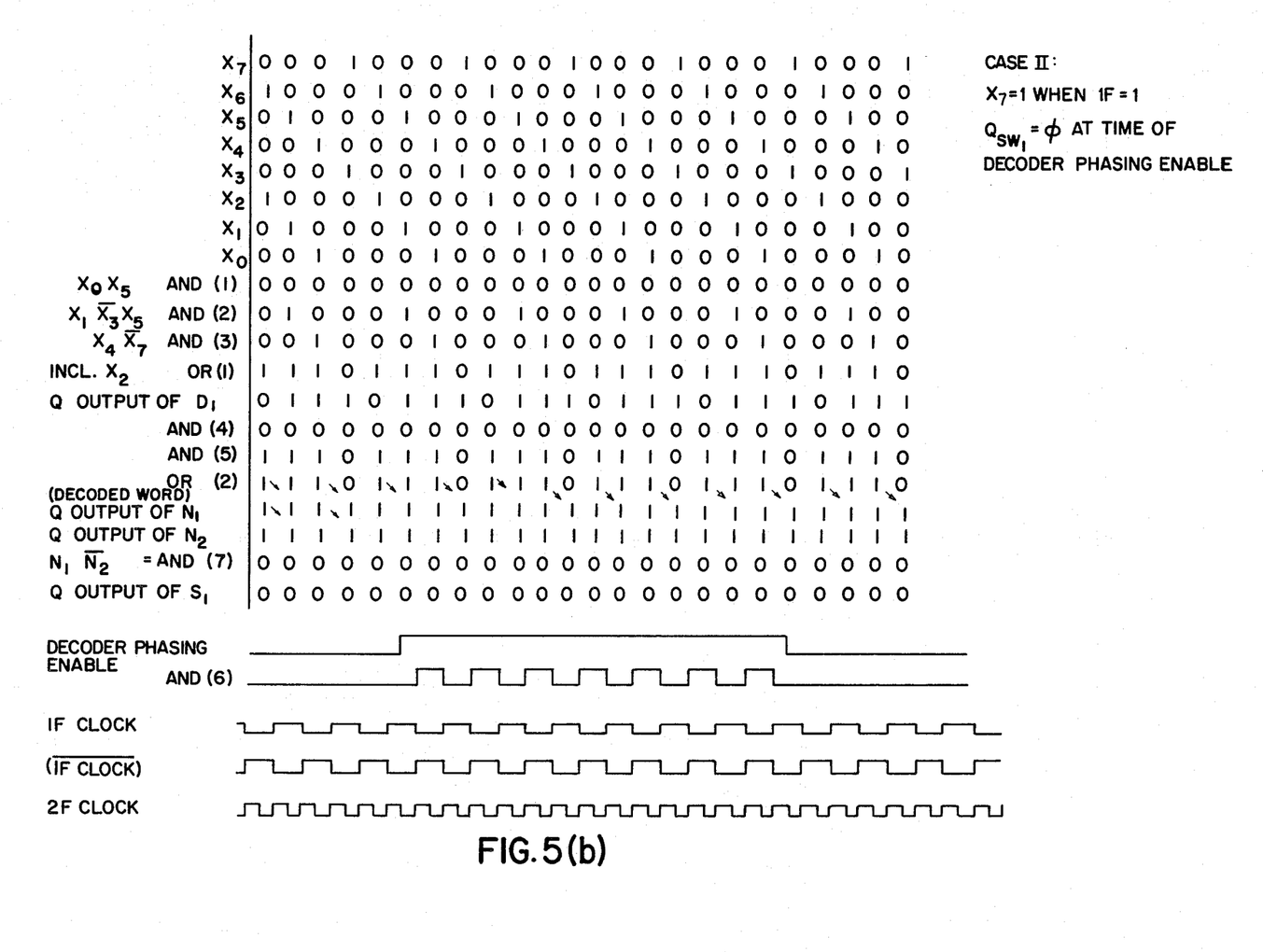
Figure 5C:
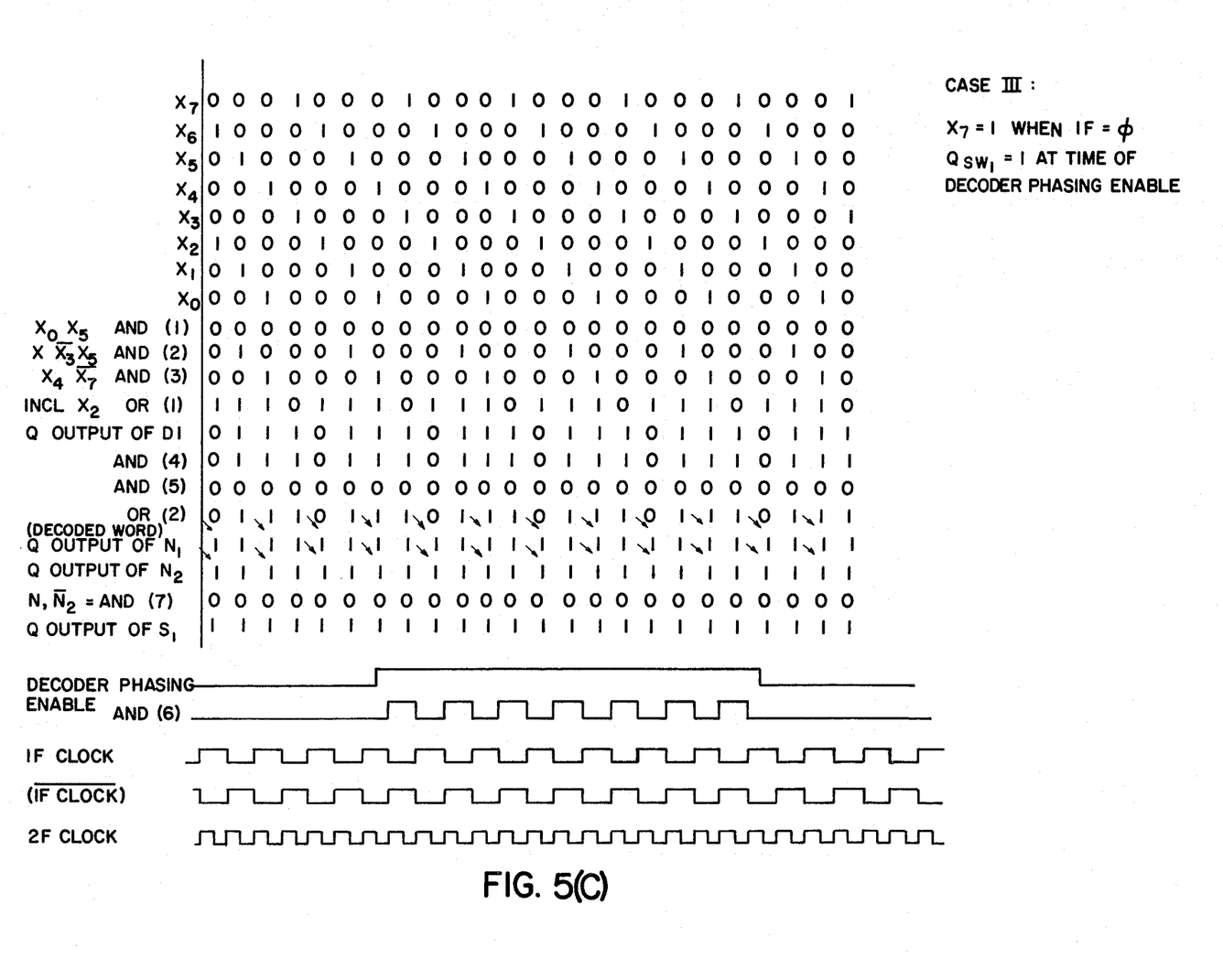
Figure 5D:
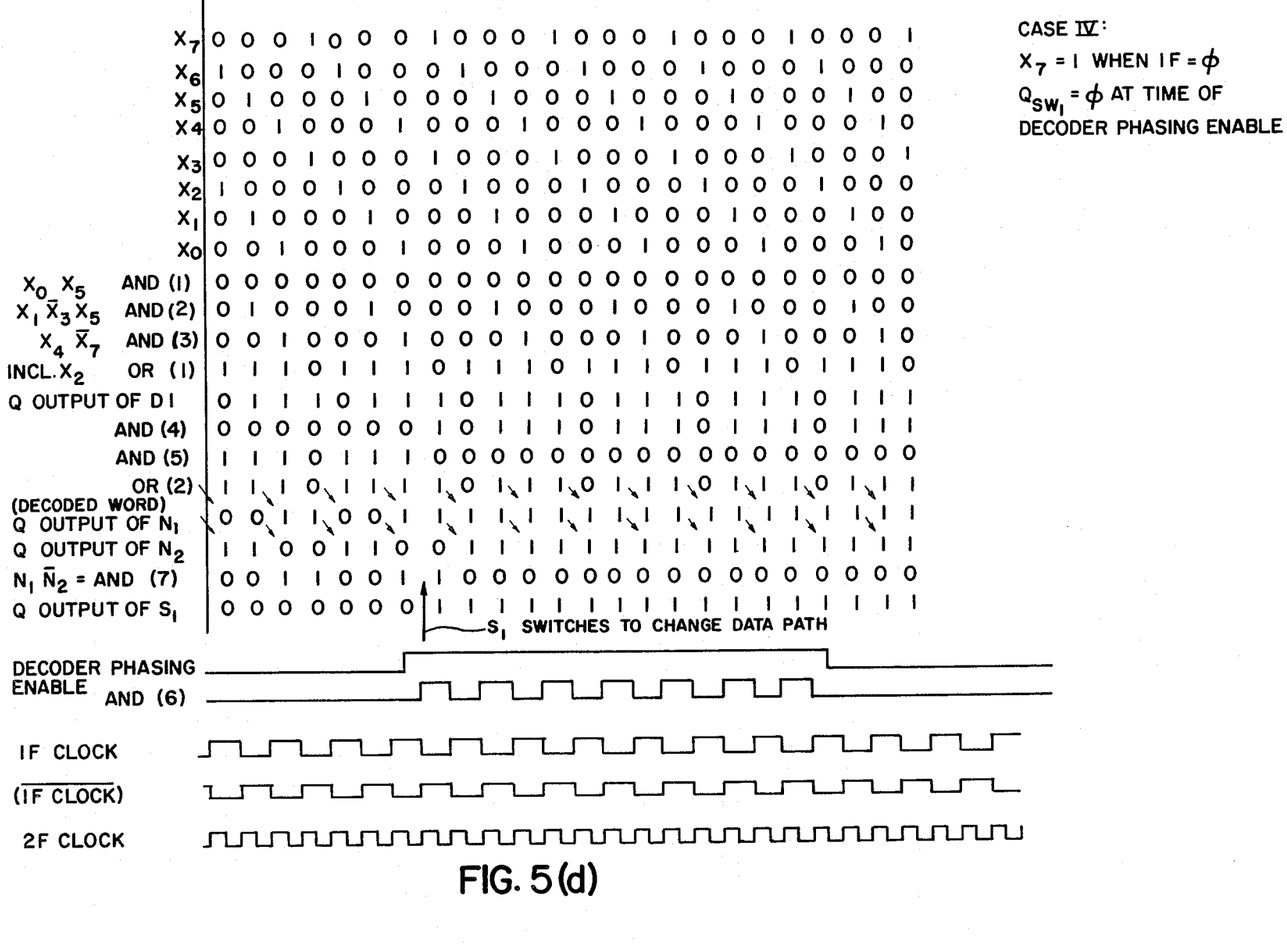

Referring to FIG. 4, there is shown in greater detail the preferred embodiment of the apparatus 10 of the present invention. The shift register 12 is an eight bit flip-flop ($X_0$-$X_7$) shift register. The encoded data bit is clocked into each one of the shift registers by the 2F clock. The decoder 14 is shown as comprising three AND logic units and an OR logic unit. AND(1) is the logic of $X_0 \cdot X_5$. AND(2) is the logic of $X_1 \cdot \overline{X}_3 \cdot X_5$. AND(3) is the logic of $X_4 \cdot \overline{X}_7$. In turn, the logic OR(1) has as its inputs $X_2$, AND(1), AND(2), AND(3). From the decoder 14 the data enters via path 15 into a one bit delay 16, which is simply another flip-flop ($D_1$) or a latch. Switch 18 comprises a JK flip-flop ($SW_1$), 3 AND gates (AND(4), AND(5), AND(6)), an OR gate (OR(2)) and a 1F clock inverter (INV(1)). The data path from the one bit delay 16 to the switch 18 is from the Q output of the flip-flop $D_1$ to an AND(4) gate. The AND(4) gate has also as its input the Q output of the JK flip-flop $SW_1$. From the decoder 14 the data also enters into the switch 18, via data path 13. This is accomplished by entering into the gate AND(5). AND(5) also has its input the $\overline{Q}$ output of the JK flip-flop $SW_1$. The gates AND(4) and AND(5) are entered into the gate OR(2). From the gate OR(2) the data is inputted into another flip-flop $N_1$, which is output storage 20. Flip-flop $N_1$ is clocked by a 1F clock. The Q output of the flip-flop $N_1$ is the decoded word. The Q output of the flip flop $N_1$ enters into the logic 22. The logic 22 comprises yet another flip-flop $N_2$ and gate AND(7). The Q output of the flip-flop $N_1$ is entered into the flip-flop $N_2$ as well as one of the inputs to the gate AND(7). The $\overline{Q}$ output of the Flip-flop $N_2$ is also entered into the gate AND(7). Flip-flop $N_2$ is also clocked at the 1F clock rate. The output of the gate AND(7) is used to control the J & K inputs of the JK flip-flop $SW_1$, which is part of the switch 18. When both the J & K inputs are high, the JK flip-flop will toggle (or switch) when the a pulse from AND(6) arrives. If they are both low, the pulse from AND(6) will have no effect. A decoder phasing enable signal also controls the JK flip-flop $SW_1$ of the switch 18 controls by passing the appropriate phase of the 1F clock signal—in this case, a clock supplied via inverter INV(1) through gate AND(6).

Referring to FIGS. 5(a-d), there are shown truth tables of four cases of the progression of coded bits of "1000 1000 1000 1000 1000" entering into the apparatus 10 of the present invention. Through the appropriate selection of the data path from the decoder to the output storage 20, an extra delay bit may be added into the data stream to create the correct phasing relationship between the encoded data bits and the decoded data bits. As can be seen from FIGS. 5(a-d), the decoded data word with proper phasing should be of a data stream comprising the bits "11 11 11 11 11". If decoder phasing is improper, the decoded data stream will consist of alternate ones and zeros "10 10 10 10" etc., as would be expected from the (2,7) dictionary of FIG. 1. The apparatus 10 of the present invention is able to automatically align the bits of the encoded word to the bits of the decoded data word if required without manipulating the system clock. Thereafter, the rest of the data stream in the encoded bits would be decoded in proper phase relationship.

From the data stream description of FIG. 3, the circuit diagram of FIG. 4 and the Truth Tables of FIGS. 5(a-d), the following actions occur in the apparatus 10 of the present invention.

With a ½ rate code, there is a 50% chance that, upon readback, the decoder phasing will be proper. With the preferred embodiment shown in FIG. 4, for the (2,7) code, there are four cases which can occur. These four cases arise due to the following circumstances:
 (1) the undecoded data stream has two possible relationships to the 1F clock;
  (a) $X_7=1$ when 1F clock=1, or
  (b) $X_7=1$ when 1F clock=0.
 (2) The J-K flip-flop $S_1$ has two possible states at the time decoder phasing is enabled;
  (a) $Q_{S1}=1$ when decoder phasing is enabled, or
  (b) $Q_{S1}=0$ when decoder phasing is enabled.
The four cases that result are:
 (I) $X_7=1$ when 1F clock=1 and $Q_{S1}=1$
 (II) $X_7=1$ when 1F clock=1 and $Q_{S1}=0$
 (III) $X_7=1$ when 1F clock=0 and $Q_{S1}=1$
 (IV) $X_7=1$ when 1F clock=0 and $Q_{S1}=0$ Note that in cases II & III the decoder phasing is already correct, and that in cases I & IV, the apparatus of the invention performs the decoder phasing operation.

In the decoder phasing field $S_2$ (FIG. 3), the expected decoder word output is "11 11 11, etc." which occurs in cases II & III. Note that in cases II & III, the activation of the "Decoder Phasing Enable" line and the presence of clock signals into gate (AND(6)) have no effect on circuit output, since the output of gate (AND(7))=0.

In cases I & IV, the original phasing is improper which results in a decoder output of alternate ones and zeros. When $Q_{N1}=1$ and $Q_{N2}=0$, the output of gate (AND(7)) is high, which makes $J_{S1}=K_{S1}=1$. This will allow the JK flip-flop $SW_1$ to toggle to the opposite state when "Decoder Phasing Enable" is high, passing the appropriately phased 1F clock through gate (AND(6)) to clock the JK flip-flop $SW_1$.

In cases I & IV, once $SW_1$ is in the appropriate state, Q output of N1 and Q output of N2 will (after the next 1F clock pulse) contain ones, which will make AND gate (AND(7))=0. This makes $J_{S1}=K_{S1}=0$, and no further switching action will occur, provided the "Decoder Phasing Enable" signal is turned off appropriately (as shown in FIG. 3 and described in the next paragraph). At this point, decoder phasing is complete and the decoded word output will be correct for all following data.

The timing of the decoder phasing enable signal is important. If the enable sign is activated during the decoding of the $S_1$ data stream, then the J/K flip-flop will flip errantly. However, it will correct itself once the $S_2$ data stream is reached. The enable signal must be turned off, however, before the $S_2$ stream has passed entirely. Otherwise, certain data patterns may cause it to change states and pass erroneous data. Thus, with the data format of FIG. 3, the enable signal may be turned on before or during the $S_2$ field, and left on at least long enough to allow the switch 18 to change states once, if necessary, and then turned off before the $S_2$ stream has passed by completely.

Figure 6:
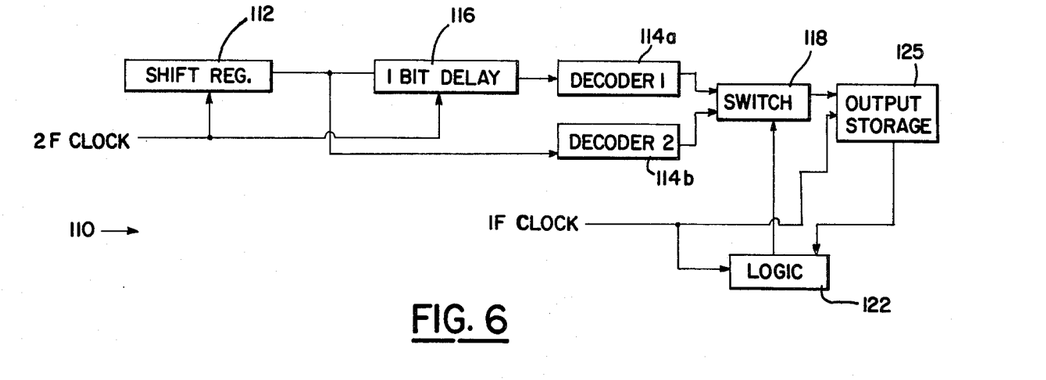
FIG. 6 is another embodiment of the present invention shown in block diagram form.

Referring to FIG. 6, there is shown another embodiment of the apparatus 110 of the present invention. The apparatus 110 comprises a shift register 112 and a one bit delay 116. Input coded bit signals are entered into the shift register 112 at a 2F clock frequency. From the shift register 112 the input bit signal also enters into the one bit delay 116. From the one bit delay 116 the input bit signals are decoded by a first decoder 114a. A second decoder 114b decodes the input bit signals from shift register 112 without having gone through the one bit delay 116. The output of the decoders 114a and 114b are switched by a switch 118. From the switch 118 the signal is propagated to an output storage 120. From output storage 120 logic circuit 122 analyzes the decoded word data to determine the appropriate switching position for the switch 118 to choose the appropriate data path from the shift register 112. From the foregoing it is seen that the embodiment shown in FIG. 2 is preferred inasmuch as one less decoder is used therein than the embodiment shown in FIG. 6.

Figure 7:
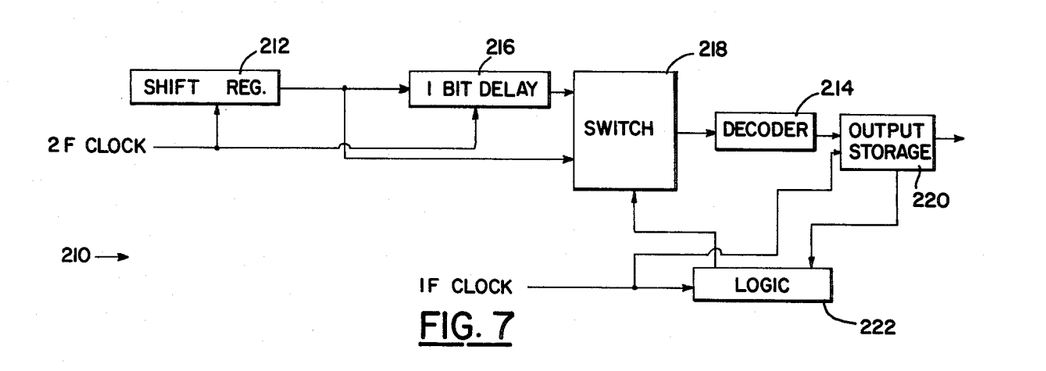
FIG. 7 is yet another embodiment of the apparatus of the present invention shown in block diagram form.

Referring to FIG. 7, there is shown yet another embodiment of the apparatus 210 of the present invention. The apparatus 210 comprises a shift register 212 into which the input bit signals are entered at a 2F clock rate. From the shift register 212 the input bit signal enters into a one bit delay 216. The input bit signals from the shift register 212 also enter into a switch 218. Another input to the switch 218 is the output from the one bit delay 216. The switch 218 determines the data path from the shift register 212, i.e., either directly from the shift register 212 or passing through a one bit delay 216. From the switch 218 the input bit signal is decoded by decoder 214 which then is sent to the output storage 220. Logic 222 operates on the decoded bit signals from the output storage 220 to determine the correct phase relationship between the input bit signals and the output bit signals. Logic 222 operates on the switch 218 to determine the correct data path from the shift register 212 in order to insure that there is a correct phase relationship between the input bit signals and the output bit signals.

While the apparatus 110 and 210 of the present invention shown in FIGS. 6 and 7, respectively, are feasible, they may be impractical due to cost constraints when compared to the apparatus 10 of FIG. 4.

The foregoing description has all been related to an apparatus that describes the decoding for use with a (2,7) run length limited variable length code having a fixed rate. The (2,7) code dictates that the input bit signal be at twice the frequency of the output bit signals, inasmuch as there are twice as many input bits per each bit of output. As previously stated, the apparatus and method of the present invention is not limited to the particular type of code.

Figure 8:
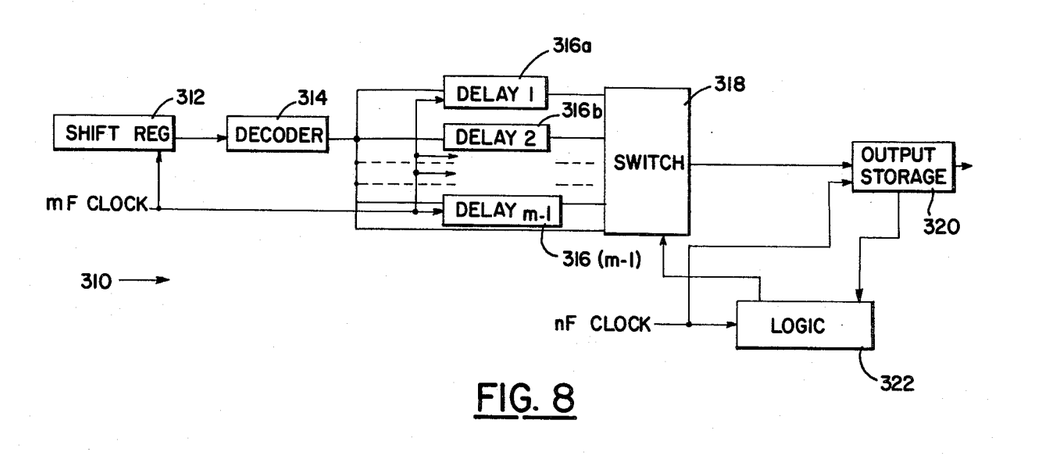
FIG. 8 is an embodiment of a generalized apparatus of the present invention shown in block diagram form.

Referring to FIG. 8, there is shown an apparatus 310 of the present invention shown in block diagram form, applicable to general type of code wherein there are M input bits for every N output bits, where M and N are integers in lowest common denominator form. As previously explained for the (2,7) code, M is equal to 2 while N is equal to 1. For the (1,8) code, M is equal to 3 while N is equal to 2. In general, the input bit signals are entered into a shift register 312 at a frequency rate of MF. The input bit signals are decoded by decoder 314. A plurality of data paths flow from the decoder 314. In general, there are M data paths. Each data path has a delay associated therewith, with one data path having zero delay, a second data path having a one bit delay, a third data path having a two bit delay and so on until the Mth data path will have M-1 bits of delay associated therewith. The M data paths are all entered into a switch 318. Switch 318 selects the appropriate data path with the appropriate delays associated therewith from the shift register 312. The output of the switch 312 is to the output storage 320. The output storage 320 is also entered into a logic circuit 322, which compares the output bit signals from the apparatus 310 with the output bit signals that are anticipated, i.e., the output bits that should be decoded by a decoder apparatus having the correct phase relationship between the input bit signals and the output bit signals. Based upon this comparison, logic 322 activates the switch 318 to select the appropriate data path from the shift register 312 with the correct delay interposed therein to insure that the correct phase relationship between the input bit signals and the output bit signals is maintained.

As previously indicated, the method and apparatus of the present invention does not require the manipulation of system clock to achieve the desired result of the correct phasing relationship between the input data bits and the output data bits. Moreover, with the use of digital logic circuits to achieve the end result, implementation of the apparatus of the present invention is much easier than the apparatus that is used to manipulate system clock, which at high data rates, tends to be analog in nature. These features are particularly desirable in a data system which involves a microprocessor or any other form of computerized control.

What is claimed is:

1. A method of converting input data bit signals representative of binary data in one form entering an apparatus at a first fixed rate to output bit signals representative of the same data in another form exiting said apparatus at a second fixed rate according to a code, wherein according to said code there are more bit signals of the data in said one form than the bit signals of the same data in said another form, said method comprising:

inputting a stream of known input bit signals into a register means of said apparatus;

decoding said known input bit signals into output bit signals and storing them in an output means;

comparing the decoded output bit signals to anticipated output bit signals that correspond to the binary data of the known input bit signals according to said code;

selecting a predetermined delay to be inserted in the path from said register means to said output means such that the decoded output bit signals are in phase with the anticipated output bit signals, and then applying the input data bit signals to said register means whereby the inserted delay will then cause properly decoded output data bit signals to be stored in said output means.

2. The invention in accordance with claim 1, wherein said code is a run-length-limited variable length code.

3. The invention in accordance with claim 2, wherein said code is of a type such that there are M input bits for every N output bits, M and N being integers in lowest common denominator form, wherein said input bit signals are input into said register at a frequency rate of MF, and wherein said predetermined delay has M possible values.

4. An apparatus for converting input data bit signals representative of binary data in one form entering said apparatus at a first fixed rate to output data bit signals representative of the same data in another form exiting said apparatus at a second fixed rate according to a code, wherein according to said code there are more bit signals of the data in said one form than the bit signals of the same data in said another form, said apparatus comprising:

input register means;

means for applying said input data bit signals to said input shift register;

means for applying a stream of known input bit signals to said input register means prior to the application thereto of said input data bit signals;

output storage means;

conversion means coupled to said input shift register means, said conversion means including decoding means, delay means, and switching means for causing one of a plurality of possible decoded signals decoded in accordance with said code to be stored in said output storage means;

said delay means providing different predetermined delays for said plurality of possible decoded signals relative to one another so that said decoded signals respectively correspond to the different possible phase relationships which may be applied to said output storage means as a result of the decoding of input bit signals in accordance with said code; and logic means responsive to the decoded known input bit signals of said stream for determining the correct phase relationship to be provided for said input bit signals and for causing said switching means to select the correct corresponding one of said possible decoded signals to be applied to said output storage means.

5. The invention in accordance with claim 1, wherein said input register means is a shift register.

6. The invention in accordance with claim 4, including means for enabling said logic means when the decoded form of said known input bit signals of said stream are available.

7. The invention in accordance with claim 6, wherein said logic means is disabled before said input data bit signals are applied to said input shift register means.

8. The apparatus of claim 4, 5, 6 or 7, wherein said code is a run-length-limited variable length code.

9. The apparatus of claim 8, wherein said code is a (2,7) fixed rate code.

10. The apparatus of claim 9, wherein there are two possible decoded signals.

11. The apparatus of claim 10, wherein said delay means provides a one bit delay between the two possible decoded signals.

12. The invention in accordance with claim 8, wherein said code is of a type such that there are M input bits for every N output bits, M and N being integers in lowest common denominator form, wherein said means for applying data bit signals to said input register means provide for inputting at a frequency rate of MF, and wherein there are M possible decoded signals.

* * * * *